(12) United States Patent
Hopkins et al.

(10) Patent No.: US 10,539,615 B2
(45) Date of Patent: *Jan. 21, 2020

(54) RECONFIGURING DEBUG CIRCUITRY

(71) Applicant: UltraSoC Technologies Limited, Cambridge (GB)

(72) Inventors: Andrew Brian Thomas Hopkins, Folkestone (GB); Andrew James Bower, Cambridge (GB); Michael Jonathan Thyer, Cambridge (GB)

(73) Assignee: UltraSoC Technologies Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/906,730

(22) Filed: Feb. 27, 2018

(65) Prior Publication Data
US 2018/0188323 A1 Jul. 5, 2018

Related U.S. Application Data

(63) Continuation of application No. 15/235,597, filed on Aug. 12, 2016, now Pat. No. 9,970,985.

(30) Foreign Application Priority Data

Aug. 12, 2015 (GB) .................................. 1514301.9

(51) Int. Cl.
*G01R 31/317* (2006.01)
*G01R 31/3185* (2006.01)
*G01R 31/3183* (2006.01)

(52) U.S. Cl.
CPC ... *G01R 31/31705* (2013.01); *G01R 31/3185* (2013.01); *G01R 31/318371* (2013.01); *G01R 31/3172* (2013.01)

(58) Field of Classification Search
CPC ............ G01R 31/317; G01R 31/31705; G01R 31/318371; G01R 31/3185
See application file for complete search history.

(56) References Cited

U.S. PATENT DOCUMENTS 7,546,507 B1 * 6/2009 Wright ............. G01R 31/31705
714/742
7,958,401 B2 6/2011 Moyer
(Continued)

FOREIGN PATENT DOCUMENTS

GB 2506826 9/2014

OTHER PUBLICATIONS

UK Search Report; Application No. GB1514301.9; dated Mar. 15, 2016; 3 pages.

*Primary Examiner* — Shelly A Chase
(74) *Attorney, Agent, or Firm* — Fish & Richardson P.C.

(57) ABSTRACT

A method of reconfiguring a current debug configuration of a debug unit connected to a peripheral circuit on an integrated circuit chip. The method comprises the debug unit collecting debug data of the peripheral circuit and outputting the debug data in a message stream. The debug unit receives a debug reconfiguration command. The debug unit transmits an indication of the current debug configuration, then reconfigures the current debug configuration to a new debug configuration in accordance with the debug reconfiguration command, then transmits an indication of the new debug configuration. The indication of the current debug configuration and the indication of the new debug configuration are transmitted adjacent to the debug data in the message stream.

20 Claims, 5 Drawing Sheets

(56) References Cited

U.S. PATENT DOCUMENTS

| | | |
|---|---|---|
| 9,753,836 B2 * | 9/2017 | Menon ................ G06F 11/3648 |
| 2009/0150725 A1 | 6/2009 | Vorbach |
| 2013/0013145 A1 | 1/2013 | Ernst et al. |
| 2013/0318398 A1 | 11/2013 | Arapov |
| 2014/0013145 A1 | 1/2014 | Hopkins |
| 2017/0045584 A1 | 2/2017 | Hopkins et al. |

* cited by examiner

RECONFIGURING DEBUG CIRCUITRY

CROSS-REFERENCE TO RELATED APPLICATION

This application is a continuation of and claims priority to U.S. patent application Ser. No. 15/235,597, filed on Aug. 12, 2016, which claims priority to United Kingdom Patent Application No. GB1514301.9, filed on Aug. 12, 2015, the entire contents of each of which are incorporated herein by reference.

BACKGROUND

This disclosure relates to debugging peripheral circuits, such as processors, on an integrated circuit chip. The disclosure is particularly relevant to debugging peripheral circuits which form part of a System-on-Chip (SoC).

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for debugging the core devices, because debugging tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of debugging tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external debugging tools to find and solve bugs within the system in the timescales demanded by the industry.

Thus, the development of SoC devices required associated development in debugging technology, which lead to the integration of some debug functionality onto the SoC. It is now customary for each core device to have an associated debug unit. Typically, the debug unit can observe the core device, for example by collecting trace data from that core device. The collected debug data is assembled into debug messages and routed through the integrated circuit chip, typically to be funnelled off chip via a debug port to an external debug controller.

The debug controller selects the type of trace data that is to be collected by setting the configuration of the debug unit. For example, that configuration may specify parameters of internal filters of the debug unit; the debug unit only collecting and outputting trace data when the parameters of those filters are met. In order to accurately process a portion of trace data, the debug controller needs to know which configuration the debug unit had at the time the portion of trace data was collected. When the debug controller instructs the debug unit to change configuration, there is a period of time during which the debug controller receives trace data but does not know which configuration the debug unit had at the time that trace data was collected. To solve this problem, the debug controller may instruct the debug unit to stop tracing prior to instructing the debug unit to change configuration, and then instruct the debug unit to start tracing again after the debug unit has changed configuration. However, this solution results in a period of time during which trace data is not collected, and hence a period of time during which the debug controller is unable to analyse the core device.

SUMMARY OF THE INVENTION

According to a first aspect of this disclosure, there is provided a method of reconfiguring a current debug configuration of a debug unit connected to a peripheral circuit on an integrated circuit chip, the method comprising, at the debug unit: collecting debug data of the peripheral circuit and outputting the debug data in a message stream; receiving a debug reconfiguration command; transmitting an indication of the current debug configuration, then reconfiguring the current debug configuration to a new debug configuration in accordance with the debug reconfiguration command, then transmitting an indication of the new debug configuration;

wherein the indication of the current debug configuration and the indication of the new debug configuration are transmitted adjacent to the debug data in the message stream.

Suitably, the debug data collected prior to transmitting the indication of the current debug configuration is collected in accordance with the current debug configuration, and the debug data collected after transmitting the indication of the new debug configuration is collected in accordance with the new debug configuration.

Suitably, the indication of the current debug configuration is a first marker embedded by the debug unit into the debug data, and the indication of the new debug configuration is a second marker embedded by the debug unit into the debug data.

The first and second markers may be change of configuration markers which identify whether or not the debug configuration of the debug unit has changed.

Suitably, the first marker identifies the current debug configuration, and the second marker identifies the new debug configuration.

The debug unit may embed the first and second markers into the debug data prior to buffering the debug data.

Suitably, the indication of the current debug configuration and the indication of the new debug configuration are control messages transmitted adjacent to the debug data messages in the message stream.

The indication of the current debug configuration may comprise the current debug configuration, and the indication of the new debug configuration may comprise the new debug configuration.

Suitably, in response to receiving only the single debug reconfiguration command, the debug unit transmits an indication of the current debug configuration, then reconfigures the current debug configuration to a new debug configuration in accordance with the debug reconfiguration command, then transmits an indication of the new debug configuration.

The method may further comprise, at the debug unit: receiving a retrieve debug configuration command, and in response transmitting the indication of the current debug configuration; after receiving the retrieve debug configuration command, receiving the debug reconfiguration command, and in response reconfiguring the current debug configuration to the new debug configuration; and after receiving the debug reconfiguration command, receiving a further retrieve debug configuration command, and in response transmitting the indication of the new debug configuration.

Suitably, the debug unit continues to collect debug data and output the debug data in the message stream throughout the reconfiguration method.

Suitably, the debug unit outputs the debug data, the indication of the current debug configuration, and the indication of the new debug configuration to a debug controller, and the debug controller discards debug data received from the debug unit between receipt of the indication of the current debug configuration and receipt of the indication of the new debug configuration.

Suitably, the method further comprises, at the debug unit, halting collection of debug data of the peripheral circuit and halting outputting the debug data into the message stream between the times at which the indication of the current debug configuration is transmitted and the indication of the new debug configuration is transmitted.

The new debug configuration may be a compound debug configuration for configuring a plurality of sub-units of the debug unit.

Suitably, at least some of the sub-units are filters, and the compound debug configuration sets parameters of those filters which determines when debug data of the peripheral circuit is collected.

The debug unit may: output the debug data, the indication of the current debug configuration, and the indication of the new debug configuration to an off-chip debug controller; and receive the debug reconfiguration command from the off-chip debug controller.

The debug unit may: output the debug data, the indication of the current debug configuration, and the indication of the new debug configuration to an on-chip debug controller; and receive the debug reconfiguration command from the on-chip debug controller.

According to a second aspect of this disclosure, there is provided an integrated circuit chip comprising: a debug unit connected to a peripheral circuit, the debug unit having a current debug configuration, and being configured to collect debug data from the peripheral circuit and output that debug data in a message stream; the debug unit being further configured to: receive a debug reconfiguration command; transmit an indication of the current debug configuration, then reconfigure the current debug configuration to a new debug configuration in accordance with the debug reconfiguration command, then transmit an indication of the new debug configuration; wherein the debug unit is configured to transmit the indication of the current debug configuration and the indication of the new debug configuration adjacent to the debug data in the message stream.

Suitably, the debug unit comprises a plurality of sub-units, and the new debug configuration is a compound debug configuration, the debug unit being configured to configure the sub-units with the compound debug configuration. At least some of the sub-units may be filters, the debug unit being configured to set parameters of the filters with the compound debug configuration.

The integrated circuit chip may further comprise an on-chip debug controller, the debug unit being configured to: output the debug data, the indication of the current debug configuration, and the indication of the new debug configuration to the on-chip debug controller; and receive the debug reconfiguration command from the on-chip debug controller.

BRIEF DESCRIPTION OF THE DRAWINGS

The present disclosure will now be described by way of example with reference to the accompanying drawings. In the drawings.

DETAILED DESCRIPTION

The following disclosure describes a debug architecture suitable for implementation on a SoC or an MCM.

Figure 5:
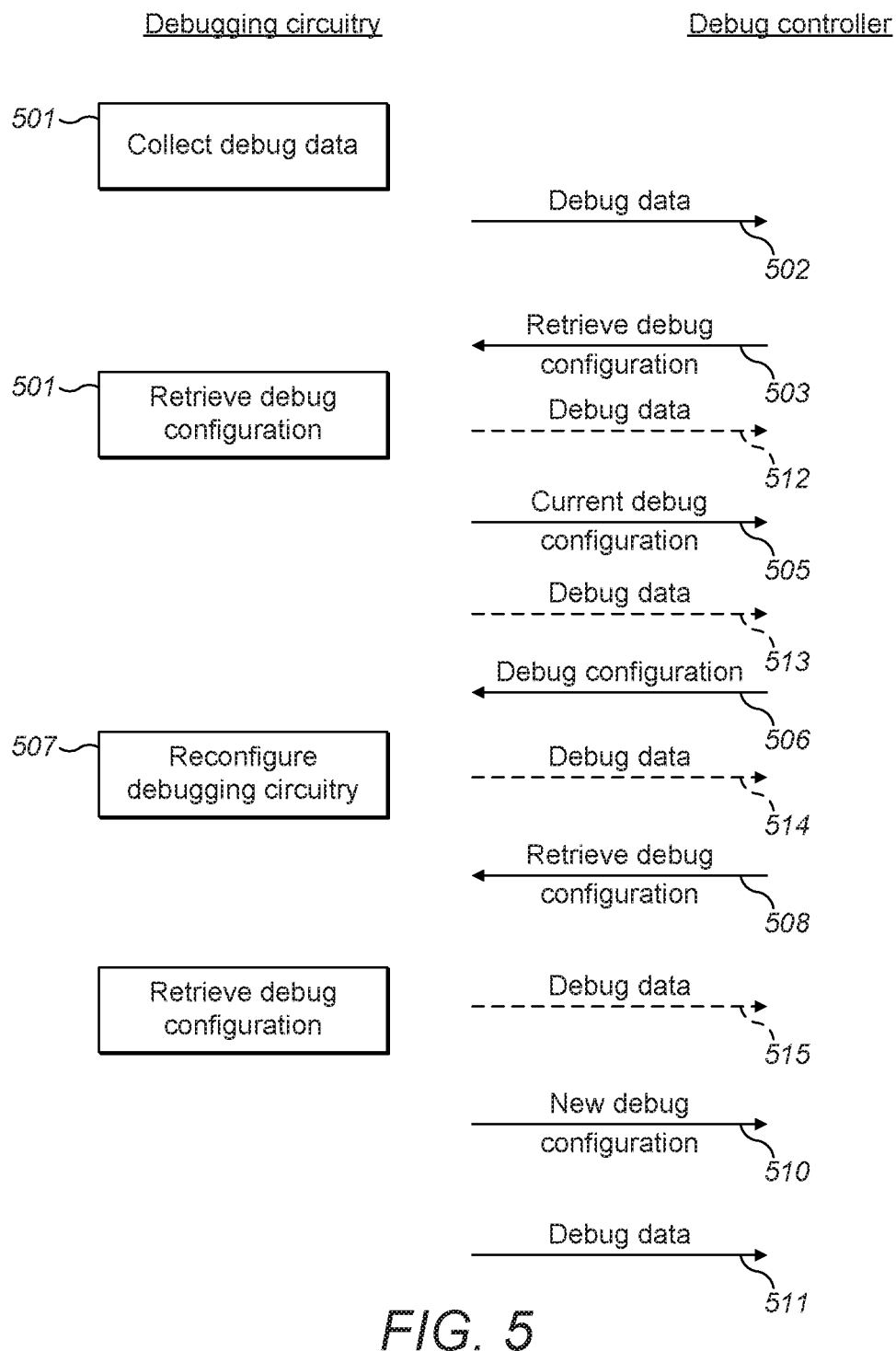
FIG. 5 illustrates a message sequence of an exemplary debug reconfiguration method.
Figure 6:
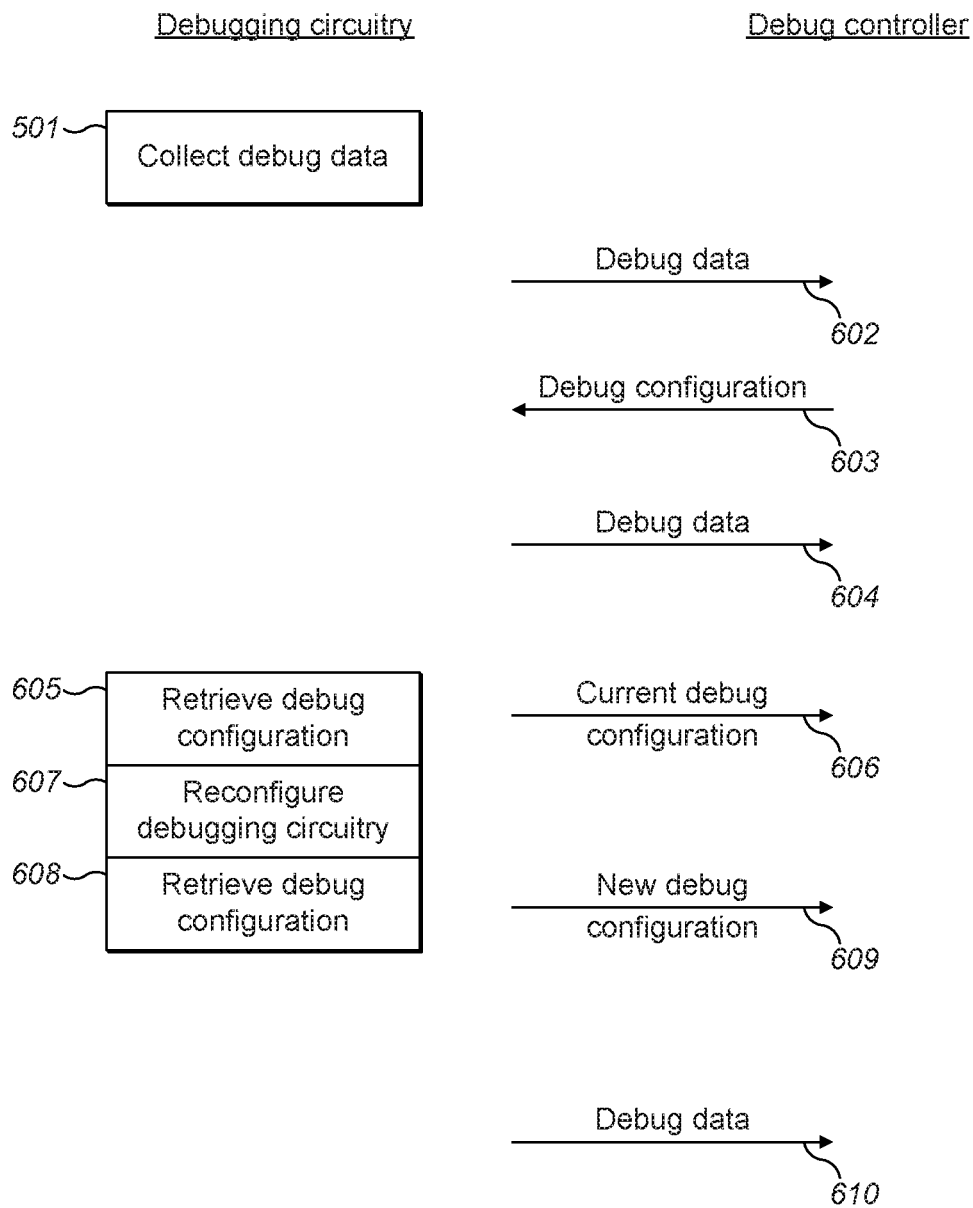
FIG. 6 illustrates a message sequence of a further exemplary debug reconfiguration method.

FIGS. 1 to 4 are schematic diagrams of exemplary debug architectures, and components within debug architectures. These figures present the structures in terms of functional blocks. Some functional blocks for carrying out functions well known in the art have in places been omitted from these figures. FIGS. 5 and 6 are message sequences illustrating methods of reconfiguring the debug configuration of the debugging circuitry. Each message sequence depicts an order in which the method of that message sequence can be performed. However, the message sequences are not intended to restrict the described methods to being implemented in the orders depicted. The steps of the methods may be carried out in alternative orders to those depicted in the message sequences.

Figure 1:
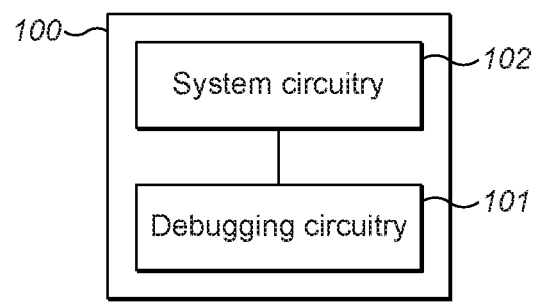
FIG. 1 is a schematic drawing of an exemplary debug architecture on an integrated circuit chip device.
Figure 2:
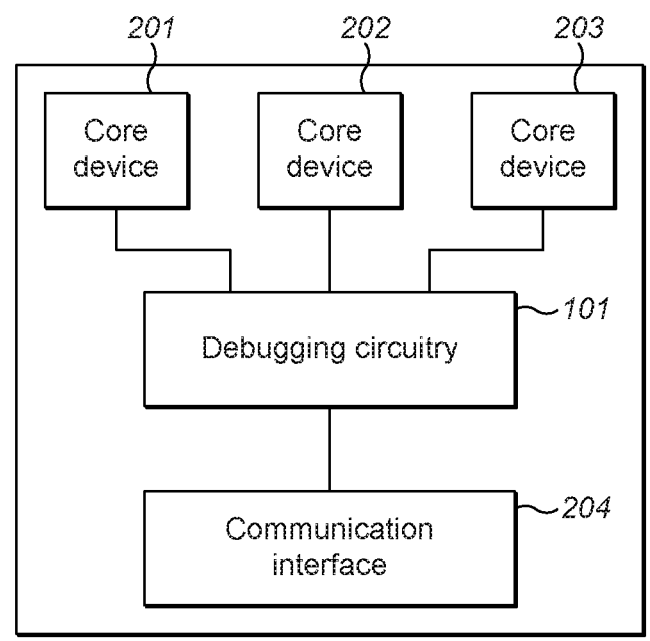
FIG. 2 is a schematic drawing of an exemplary debug architecture on an integrated circuit chip device.

FIG. 1 illustrates the general structure of an exemplary debug architecture for a SoC 100. Debugging circuitry 101 is arranged to debug system circuitry 102. FIG. 2 illustrates exemplary system circuitry comprising core devices and a communication interface. The core devices 201, 202 and 203 of the SoC are peripheral circuits to the debugging circuitry, each of which is connected to the debugging circuitry 101. Although FIG. 2 illustrates three core devices, any number of core devices can be suitably integrated into the debug architecture. Exemplary core devices include a DSP (digital signal processor), video processor, applications processor or CPU (central processor unit), graphics processor, system memory, bus, system interconnect, RTOS (real-time operating system), software, data, custom circuit and a data engine. However, any component of a SoC is suitable for being incorporated into the debug architecture as a core device on FIG. 2. The core devices may be emulators or simulators of other devices on the chip. For example, a core device may emulate a processor.

The debugging circuitry is able to manipulate the operation of the core devices and monitor the operation of the core devices. The debugging circuitry is connected to a communication interface 204. Communication interface 204 may be configured to communicate with entities off-chip. For example, debugging circuitry 101 may communicate with an off-chip debug controller via communication interface 204. Communication interface 204 may also be configured to communicate with other entities on-chip. For example, debugging circuitry 101 may communicate with an on-chip debug controller via communication interface 204. Although FIG. 2 illustrates one communication interface, any number of communication interfaces can be integrated onto the SoC. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe and CAN.

Figure 3:
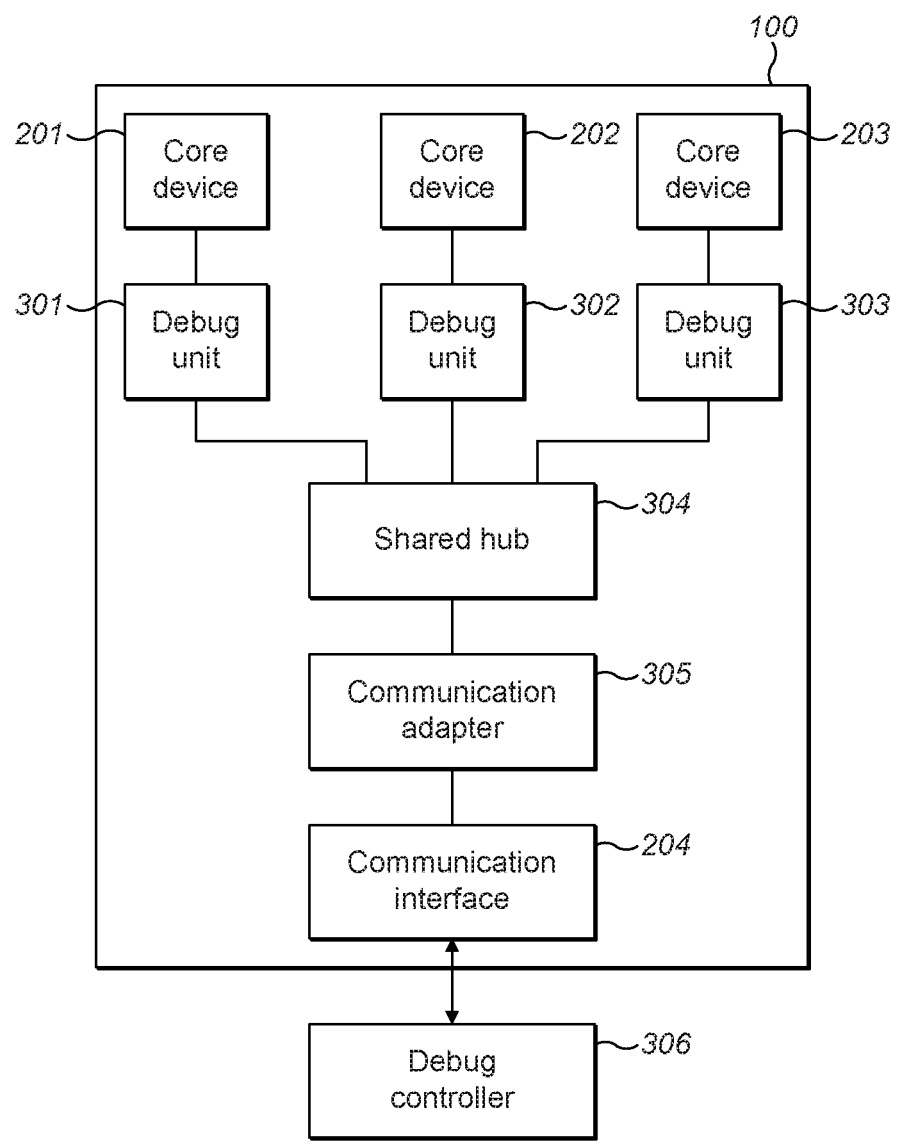
FIG. 3 is a schematic drawing of an exemplary debug architecture comprising a shared hub.

The structure of the debugging circuitry is implementation-dependent. FIG. 3 illustrates an example in which the debugging circuitry comprises a shared hub 304, debug units 301, 302, 303 and a communication adapter 305. In FIG. 3, each core device 201, 202, 203 of the SoC is respectively connected to its own debug unit 301, 302, 303. The debug units may be configured to passively or actively observe the attached core device. A debug unit which passively observes a core device is limited to analysing the output of that core device. Conversely, a debug unit which actively observes a core device may analyse the output of the core device, and additionally may control the core device to modify its operation. For example, the debug unit may control the core device to slow down the speed at which the core device operates or to stop a processor of the core device and restart it again. The communication interface 204 is connected to a communication adapter 305. The communication adapter adapts signals that it receives to a format that is suitable for the communication interface that it is connected to. The communication interface 204 communicates signals to an off-chip debug controller 306. Each debug unit and the communication adapter is connected to a shared hub 304. Shared hub 304 routes signals between the devices on the chip. For example, the shared hub routes messages between the debug units. The shared hub also routes messages between the communication adapter and the debug units. The shared hub may also comprise resources which are shared between the debug units. For example, the shared hub may comprise a shared buffer for use by the debug units. By locating such resources in the shared hub as opposed to in the debug units, the debug units are made smaller and hence can be more easily integrated across the chip.

Figure 4:
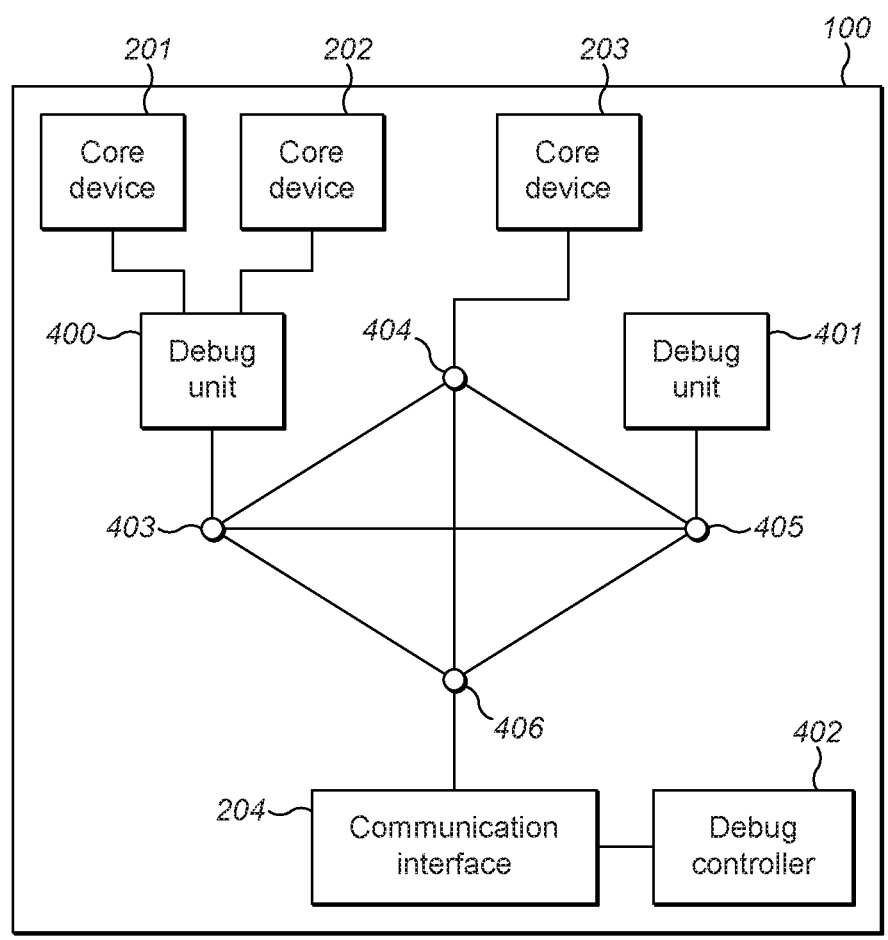
FIG. 4 is a schematic drawing of an exemplary debug architecture comprising a mesh network.

FIG. 4 illustrates another exemplary structure of the debugging circuitry which comprises a mesh network of nodes 403, 404, 405, 406 and debug units 400, 401. In FIG. 4, core devices 201 and 202 are both connected to the same debug unit 400. Core device 203 is not directly connected to a debug unit. Debug unit 401 is connected to node 405 of the mesh network, but not directly connected to a core device. The communication interface 204 communicates signals to an on-chip debug controller 402. The mesh network of nodes routes messages between the components of the SoC.

The debugging circuitry may comprise other types of interconnection for routing messages between components of the SoC. For example, the debugging circuitry may comprise a bus or a ring network. Alternatively, the debugging circuitry may comprise any combination of one or more shared hubs, buses, ring networks and mesh networks.

The debugging circuitry comprises one or more debug units. A debug unit may be directly connected to a core device (as shown in FIG. 3). A debug unit may be directly connected to more than one core device (as shown in FIG. 4). A debug unit may be not directly connected to a core device, but connected to the interconnection of the debugging circuitry (as shown in FIG. 4).

Suitably, the debugging circuitry is controlled by a debug controller. As described above, the debug controller may be located off-chip or on-chip. An alternative configuration may be implemented in which both an on-chip and an off-chip debug controller are used. In this situation, the off-chip debug controller is the dominant controller, in other words it acts as a master to the on-chip debug controller.

Suitably, the components of the debugging circuitry communicate using debug messages. These messages may be assembled into packets for transporting through the integrated circuit chip. The debug messages may contain control information to control the operation of part of the debugging circuitry or system circuitry. Alternatively, the debug messages may contain debug data. For example, the debug data may be trace data. Trace data is the output of a component of the system circuitry which a debug unit has recorded passively whilst that component of the system circuitry continues executing. The trace data may be program traces or data traces. As another example, the debug data may be the state of a component of the system circuitry or the state of a component of the debugging circuitry. For example, the debug data may be a state of a performance counter. Performance counters may be used to count a variety of events from system circuitry, such as signal edges, clock cycles a signal is high or low for, time spent in a given operational state, time a register is at a specific value or within a prescribed range, or error conditions. This type of debug data may be used to infer the state or operation of part of the system circuitry, or to identify whether specific events have or have not occurred.

As mentioned above, the debug controller may be either on-chip, off-chip or both. Regardless of its location, the debug controller selects the type of debug data that is to be collected by setting the configuration of the debugging circuitry. The debug controller sets the configuration of the debugging circuitry by sending one or more commands to the debugging circuitry 101 via the communication interface 204. As mentioned above, the debugging circuitry typically comprises one or more debug units. The reconfiguration command may include shared debug-unit level configuration, for example (i) whether the debug unit is enabled, (ii) timer configuration, (iii) which flow to send debug messages on, and (iv) whether to throttle the debug data. Each debug unit may only have one set of configuration registers.

Thus, the debug unit only stores one debug configuration at a time. The debug configuration may be changed in multiple steps. The debug configuration may be changed whilst debug data is being generated and output to the debug controller. Alternatively, each debug unit may have a first and second set of configuration registers. Thus, the debug unit is able to preload a new debug configuration into the second set of configuration registers whilst generating and outputting debug data in accordance with a current debug configuration in the first set of configuration registers. The debug unit is then able to switch to the new debug configuration more quickly than if the debug unit only has one set of configuration registers.

The debug units themselves typically comprise several sub-units, for example filters and counters. In an example, one of the sub-units of a debug unit is a filter, and the debug reconfiguration command comprises a new configuration of the filter. The new configuration specifies the parameters of the filter. The parameters of the filter affect the operation of the filter. The filter may be used to determine when trace data is collected and outputted. For example, trace data may only be collected when the parameters of the filter are met.

A debug reconfiguration command sent by the debug controller to the debugging circuitry may comprise a compound debug configuration. The compound debug reconfiguration command may be sent in a single control message from the debug controller to the debugging circuitry. Alternatively, the compound debug reconfiguration command may be transmitted from the debugging circuitry in a plurality of control messages. This compound debug configuration may comprise a configuration state for a debug unit as a whole. Additionally, or alternatively, the compound debug configuration may comprise one or more configurations for configuring a plurality of sub-units of the debug unit. The same configuration may be applied to a plurality of the sub-units of the debug unit. Different configurations may be applied to a plurality of the sub-units of the debug unit. Those sub-units may, for example, comprise a set of filters and a plurality of counters, each filter associated with a set of counters. Thus, taking the example of a debug unit having four filters, each having four counters associated with it, this results in 16 subunits. Each of these 16 sub-units receives configuration from the debug controller via an individually received debug configuration command or a compound debug configuration command. In another example, the sub-units may comprise a set of filters and a plurality of counters which are configured independently, such that the counters are configured to act depending on the outcome of the filtering process. In this case, the number of counters is independent of the number of filters, thus for example, a debug unit may comprise four filters and eight counters totalling 12 sub-units in total. In another example, a sub-unit may comprise a counter in combination with a filter, which are used together to perform an operation. For example, in order to count all bus transactions writing to address x, a filter may filter those transactions writing to address x, and the counter count the filtered transactions. A condition of the filter may be that when the counter reaches count M, a trigger is generated. In another example, the sub-units may comprise hierarchical filters. The hierarchical filters may comprise a first layer filter, followed by several second layer filters. For example, the first layer filter may filter transactions to address A. Only those transactions to address A are then filtered by the second layer filters, each of which filters by a different ID. A counter is associated with each second layer filter, which increments when a transaction to address A with its second layer filter ID occurs.

In order to be able to usefully analyse the debug data it receives, the debug controller needs to know the configuration of the debugging circuitry at the time that that debug data was collected. Prior to sending the debug reconfiguration command, the debug controller knows that the debug data it has received was collected in accordance with the current (old) debug configuration. The debug controller knows that following sending the debug reconfiguration command, at some unknown future time, the debug data it receives will have been collected in accordance with the new (reconfigured) debug configuration of the debug reconfiguration command. In between these times, there is a window of uncertainty as to which configuration was applied to the debugging circuitry at the time that the debug data was collected. The debug controller does not know whether the current debug configuration or the new debug configuration was applied, or whether the new debug configuration was partially applied such that some sub-units of the debugging circuitry were operating under the current debug configuration and some were operating under the new debug configuration.

The following describes methods of reconfiguring the debugging circuitry in such a way as to reduce the window of uncertainty as to which debug configuration was applied to the debugging circuitry at the time that the debug data was collected.

In the implementations described herein, the debugging circuitry transmits an indication of the current debug configuration to the debug controller immediately before changing the current debug configuration to the new debug configuration in accordance with the debug reconfiguration command. Additionally, the debugging circuitry transmits an indication of the new debug configuration to the debug controller immediately after changing the current debug configuration to the new debug configuration. The debug data collected by the debugging circuitry prior to transmitting the indication of the current debug configuration is collected in accordance with the current (old) debug configuration. The debug data collected by the debugging circuitry after transmitting the indication of the new (reconfigured) debug configuration is collected in accordance with the new debug configuration. Both the message comprising the indication of the current debug configuration and the message comprising the indication of the new debug configuration are transmitted adjacent to the debug data in the debug message stream transmitted from the debugging circuitry 101 through the communication interface 204 to the debug controller. The message comprising the indication of the current debug configuration and the message comprising the indication of the new debug configuration are interleaved into the debug message stream in such a way as to be time-synchronised with the collected debug data in the debug message stream. Thus, the debug controller considers the debug data it receives from the debugging circuitry up until receipt of the indication of the current debug configuration to be validated as having been collected whilst the debugging circuitry had the current debug configuration. Similarly, the debug controller considers the debug data it receives from the debugging circuitry immediately after receipt of the indication of the new debug configuration to be validated as having been collected whilst the debugging circuitry had the new debug configuration.

FIG. 5 illustrates a message sequence between the debug controller and the debugging circuitry in a first method of reconfiguring the debug configuration of the debugging circuitry. Initially, debugging circuitry is collecting debug data (501) and outputting that debug data (502) to the debug controller in accordance with its current debug configuration. The debug controller sends a command to the debugging circuitry to retrieve the debug configuration (503). In response, the debugging circuitry retrieves the current debug configuration (504), and transmits the current debug configuration to the debug controller (505). On receiving the current debug configuration, the debug controller then sends a command to the debugging circuitry to reconfigure the debug configuration to the new debug configuration (506). In response, the debugging circuitry reconfigures the current debug configuration of the debugging circuitry to the new debug configuration (507). The debug controller then sends a command to the debugging circuitry to retrieve the debug configuration (508). In response, the debugging circuitry retrieves the new debug configuration (509), and transmits the new debug configuration to the debug controller (510). The debugging circuitry then collects and outputs debug data (511) in accordance with the new debug configuration.

Although FIG. 5 depicts the debug controller as waiting until it has received the current debug configuration at message 505 before sending the debug reconfiguration command at message 506, the debug controller may alternatively send the debug reconfiguration command 506 before it has received the current debug configuration 505.

The debugging circuitry may continue to collect and transmit debug data to the debug controller during the debug reconfiguration method. This is illustrated on FIG. 5 by optional debug data messages 512, 513, 514 and 515. In this case, the debug controller may discard debug data messages received from the debugging circuitry between receipt of the current debug configuration message 505 and receipt of the new debug configuration message 510. Alternatively, the debug controller may retain the debug data messages 512, 513, 514 and 515. In some situations this debug data may still be useful even though the debug controller does not know which debug configuration was implemented at the time that that debug data was generated. In an example, a first debug configuration causes the debugging circuitry to count the number of transactions satisfying narrow filtering criteria. Having not counted any transactions, the debug controller issues a second debug configuration which causes the debugging circuitry to count the number of transactions satisfying broader filtering criteria which encompass the narrow filtering criteria. Having still not counted any transactions, a deduction may be made that no transactions satisfying the narrow filtering criteria occurred during the time periods that any of the following configurations applied: the narrow filtering criteria, the changeover to the broader filtering criteria, and the broader filtering criteria. This deduction is only valid if the debug data messages during the changeover period are retained and their content analysed by the debug controller.

Alternatively, as part of, or an adjacent subsequent message to, the retrieve debug configuration message 503, the debug controller may instruct the debugging circuitry to halt collection of debug data of the portions of the system circuitry that are monitored by the portions of the debugging circuitry which the debug configuration has been retrieved in respect of. Then, as part of, or an adjacent subsequent message to, the retrieve debug configuration message 508, the debug controller may instruct the debugging circuitry to restart collection of debug data of the portions of the system circuitry that are monitored by the portions of the debugging circuitry which the debug configuration has been retrieved in respect of.

The debugging circuitry may priorities outputting the current debug configuration message (505) and the new debug configuration message (510) over outputting the debug data (512, 513, 514, 515). The debugging circuitry may implement this by halting or delaying output of the debug data in order to have a sufficient length time slot to send the debug configuration messages (505, 510).

FIG. 6 illustrates a message sequence between the debug controller and the debugging circuitry in a second method of reconfiguring the debug configuration of the debugging circuitry. Initially, debugging circuitry is collecting debug data (601) and outputting that debug data (602) to the debug controller in accordance with its current debug configuration. The debug controller sends a command to the debugging circuitry to reconfigure the debug configuration to the new debug configuration (603). The debugging circuitry continues to collect and transmit debug data (604) until it has received and processed the debug reconfiguration command 603. On receiving and processing the debug reconfiguration command 603, the debugging circuitry responds by performing the following series of steps in immediate succession: (i) retrieving the current debug configuration (605) and sending the current debug configuration to the debug controller (606), (ii) reconfiguring the current debug configuration of the debugging circuitry to the new debug configuration (607), and (iii) retrieving the new debug configuration (608) and sending the new debug configuration to the debug controller (609). The debugging circuitry then collects and outputs debug data (610) in accordance with the new debug configuration.

The debugging circuitry sends the current debug configuration (606), changes the configuration of the debugging circuitry (607), and sends the new debug configuration (609) all as adjacent actions. The two messages 606 and 609 are sent in the same message cycle or consecutive message cycles. Suitably, the two messages 606 and 609 form part of the same message packet to the debug controller. When these actions are performed in immediate succession, no trace data is collected or transmitted by the debugging circuitry during the actions of retrieving and sending the current debug configuration, reconfiguring the debugging circuitry, and retrieving and sending the new debug configuration.

A sufficient time slot is required to send the new debug configuration. The debugging circuitry may delay reconfiguring the debugging circuitry (607) by a short time period until there is a sufficient length time slot to send the new debug configuration (609) such that the new debug configuration message (609) immediately follows the change of debug configuration. The debugging circuitry may delay initiating the process of retrieving (605) and sending the current debug configuration (606), reconfiguring the debugging circuitry (607), and retrieving (608) and sending the new debug configuration (609) until there is a sufficient length time slot to send both the current debug configuration (606) and the new debug configuration (609) in the same message cycle (or adjacent message cycles depending on the implementation).

The debugging circuitry may not send the current debug configuration message 606. Instead, in response to the debug reconfiguration command, the debugging circuitry may reconfigure the debugging circuitry and then immediately send the new debug configuration message 609.

Suitably, the debug reconfiguration command (506, 603) is sent as a control message from the debug controller to the debugging circuitry. Similarly, in the implementation in which the retrieve debug configuration commands (503, 508) are sent from the debug controller to the debugging circuitry, these too are sent as control messages.

The messages that the debugging circuitry sends back to the debug controller comprising the debug configuration applied at the time (i.e. current debug configuration message (505, 606) and new debug configuration message (510, 609)) are also control information. These may be sent as control messages.

As described above, preferably, the components of the debug architecture communicate only using messages. Each interface between a pair of components of the architecture is configured to transport any message, whether that message comprises control data, debug data or other types of data. Suitably, the interface transports the messages over a plurality of flows. The flows are assigned different relative properties. Each message identifies the flow that it is transported on via a flow identifier comprised in the header of the message. The flow associated with a message may be used to determine whether to transport the message, and when to transport the message. The flow may also be used by the entity receiving the message to decide whether to store the content of the message, discard the message, or route the message onto another entity. Data transported on the different flows may be segregated by data type, for example control data may be transported on a different flow to debug data. Different communication mechanisms may be used on the different flows to suit the nature of the data being transported. For example, a communication mechanism having a higher quality of service may be used for the control flow compared to the debug data flow since the integrity of the control data is critical. A communication mechanism with a faster data rate but lower quality of service may be used for the debug data flow in order to maximise the amount of debug data which is transported. Suitably, the control flow is prioritised over the debug data flow in order to guarantee transport of the control data whilst enabling transport of the debug data on a best-efforts basis. The control flow and the debug data flow are logically different flows but configured to be transported over the same physical flow. The control flow and the debug data flow are interleaved before leaving the debugging circuitry, for transport to the debug controller.

The messages comprising the currently applied debug configuration (505, 510, 606, 609) may be control messages sent on the same control flow that the debug controller used to send the debug reconfiguration command (506, 603) and optionally the retrieve debug configuration commands (503, 508). The control flow and the debug data flow are interleaved before leaving the debugging circuitry, thus the messages comprising the currently applied debug configuration (505, 510, 606, 609) are interleaved and synchronised with the debug data messages generated when the debugging circuitry had the corresponding debug configuration. Both the messages comprising the currently applied debug configuration (505, 510, 606, 609) and the corresponding debug data messages are sent in the same message packet to the debug controller.

Timestamps may be applied to control messages on the control flow and also to debug data messages on the debug data flow. For example, the debugging circuitry may apply a timestamp to each debug configuration on retrieving the debug configuration. Alternatively, the debugging circuitry may apply a timestamp to each control message on creation of that control message. Suitably, when the debugging circuitry interleaves the control flow and the debug data flow, it does so in time order according to the timestamps on the respective flows. Alternatively, the debugging circuitry may interleave the control flow and the debug data flow without reference to the timestamps. The debug controller may then reconstruct the time order of the control messages and the debug data messages with reference to their respective timestamps. There may be a finite set of timestamp values, and hence any one timestamp value is reused periodically. Suitably, a time index is inserted (for example by shared hub 304) onto all logical flows. This time index is incremented when the timestamp value set begins another repeat, i.e. when the timestamp values wrap around. Thus, if the debug data flow is transporting messages much more slowly than the control flow (or vice versa), the debugging circuitry/debug controller is able to retain synchronisation by matching together debug data messages and control messages having the same timestamp value and the same time index value.

In another implementation, the messages that the debugging circuitry sends back to the debug controller comprising the debug configuration applied at the time (i.e. current debug configuration message (505, 606) and new debug configuration message (510, 609)) may be sent on the debug data flow. Suitably, the information is embedded in the debug data by the debugging circuitry. The debugging circuitry may identify the control flow that the control command from the debug controller (503, 506, 508, 603) was sent on in the response that is sent on the debug data flow.

Taking a particular debug unit as an example, the debug unit is collecting trace data from a connected core device, and buffering this trace data prior to outputting it in a trace flow to the communication interface to be forwarded to the debug controller. In the case of the method of FIG. 5, the debug unit receives the retrieve debug configuration command 503. The debug unit retrieves its current debug configuration and inputs it to the trace data buffer. The debug unit then continues to collect trace data and input this to the trace data buffer. The debug unit then receives the debug reconfiguration command 506. The debug unit changes the debug configuration in accordance with the debug reconfiguration command and starts to collect trace data in accordance with the new debug configuration and input this to the trace data buffer. The debug unit then receives the retrieve debug configuration command 508. The debug unit responds by retrieving its debug configuration which is now the new debug configuration and inputting this to the trace data buffer. The debug unit then continues to collect trace data and input this to the trace data buffer. The buffered data is then output on the trace flow to the debug controller. Thus, the configuration control information is synchronised to the trace data. This method ensures better synchronisation of the configuration control information and the trace data since the configuration control information is inserted into the trace data flow on collection of the trace data prior to any buffering steps. The configuration control information and the trace data propagate through the internal pathways of the SoC in synchronisation.

In the case of the method of FIG. 6, the debug unit receives the debug reconfiguration command 603. In response, the debug unit retrieves its current debug configuration and inputs this to the trace data buffer. The debug unit immediately follows this action by changing the debug configuration in accordance with the debug reconfiguration command. The debug unit immediately follows this action by retrieving its new debug configuration and inputting this to the trace data buffer. The debug unit then continues to collect trace data and input this to the trace data buffer. The buffered data is then output on the trace flow to the debug controller. Thus, the configuration control information is synchronised to the trace data. This method ensures better synchronisation of the configuration control information and the trace data since the configuration control information is inserted into the trace data flow on collection of the trace data prior to any buffering steps. The configuration control information and the trace data propagate through the internal pathways of the SoC in synchronisation.

The above describes the debugging circuitry as sending the current debug configuration and the new debug configuration to the debug controller. Instead of sending the actual applied debug configuration, the debugging circuitry may send some other indication of the debug configuration. For example, the debugging circuitry may send a marker, such as a numerical identifier, which identifies the applied debug configuration. Alternatively, the debugging circuitry may send a marker which identifies that the debug configuration has changed or not changed since the last time it reported the indication of the applied debug configuration. Since the debug controller instructed the debugging circuitry to change the debug configuration to a new debug configuration, a marker identifying that the debug configuration is the same or has changed is sufficient for the debug controller to infer which debug configuration is applied. Thus, in the example of the preceding two paragraphs, the debug unit sends an indication of the debug configuration by inserting a marker into the trace data buffer which indicates whether the debug configuration is the same as before or has changed. This marker is synchronised with the trace data that it is embedded in. Suitably, in a multi-debug controller architecture, the marker indicating the debug configuration also identifies which debug controller initiated the debug configuration command sequence.

The trace decoder at the debug controller receives the marker. If the marker indicates that the debug configuration is the same as before, then the trace decoder does not alter its parameters and continues to decode the subsequently received trace data as before. If the marker indicates that the debug configuration has changed, then the trace decoder looks up the new debug configuration, and changes the configuration of the trace decoder in accordance with the new debug configuration. The trace decoder may alter its parameters such that the trace data is decoded in a different way. The trace decoder may alter its parameters to forward the subsequently received trace data to a different part of the debug controller.

In retrieve debug configuration messages 503, 508, the debug controller may request that the debugging circuitry retrieve all or a part of the debug configuration that is to be changed. This is a sub-set of the total current state of the debugging circuitry. Similarly, in the messages that the debugging circuitry sends to the debug controller specifying the applied debug configuration (505, 510, 606, 609), the debugging circuitry may send all or part of the debug configuration that is to be changed.

In known systems, in order for the debug controller to identify which debug configuration was applied when the trace data was collected, the debug controller instructs the debug unit to stop tracing the core device whilst the debug reconfiguration is occurring. The methods described herein enable the debugging circuitry to continue to collect debug data of the core device whilst the debug reconfiguration is occurring, and for the debug controller to know what the debug configuration was at the time that all, or almost all, of the debug data was collected.

Each component of the SoCs illustrated in FIGS. 1 to 4 may be implemented in dedicated hardware. Alternatively, each component of the SoC illustrated in FIGS. 1 to 4 may be implemented in software. Some components may be implemented in software, whilst other components are implemented in dedicated hardware.

Suitably, debugging circuitry 101 including any debug units and communication interfaces are hardware circuits forming part of SoC 100. Preferably, debug units for controlling and/or monitoring complex core devices and peripherals such as processors use suitably complex state machines as part of their control unit. Suitably, communication interfaces use suitably complex state machines to implement their complex protocols. Various approaches to realising state machines are known. Such state machines can be realised using: (i) only logic gates; (ii) a combination of logic gates and memory, where the memory is used to contain tables of values to simplify the state machine's operation or to make it programmable; or (iii) a processor core to execute software stored in memory. Where a processor core is used it can be: (i) integral to the specific debug unit, communication interface, or other debugging circuitry; or (ii) shared between several debug units to reduce their implementation resources and cost.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. Further software can be provided at the computing-based device to implement the methods described herein. The methods described herein may be performed by software in machine readable form on a tangible storage medium.

The above description describes the system circuitry and debugging circuitry as being comprised on the same SoC. In an alternative implementation, the system circuitry and debugging circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the debugging circuitry may be distributed across more than one integrated circuit chip of the MCM. Thus, the method and apparatus described above in the context of an SoC also apply in the context of an MCM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of reconfiguring a current debug configuration of a debug unit connected to a peripheral circuit on an integrated circuit chip, the method comprising, at the debug unit:
   collecting debug data of the peripheral circuit and outputting the debug data in a message stream;
   receiving a debug reconfiguration command;
   transmitting an indication of the current debug configuration, then reconfiguring the current debug configuration to a new debug configuration in accordance with the debug reconfiguration command, then transmitting an indication of the new debug configuration;
   wherein the indication of the current debug configuration and the indication of the new debug configuration are transmitted adjacent to the debug data in the message stream.

2. A method as claimed in claim 1, wherein the debug data collected prior to transmitting the indication of the current debug configuration is collected in accordance with the current debug configuration, and the debug data collected after transmitting the indication of the new debug configuration is collected in accordance with the new debug configuration.

3. A method as claimed in claim 1, wherein the indication of the current debug configuration is a first marker embedded by the debug unit into the debug data, and the indication of the new debug configuration is a second marker embedded by the debug unit into the debug data.

4. A method as claimed in claim 3, wherein the first and second markers are change of configuration markers which identify whether or not the debug configuration of the debug unit has changed.

5. A method as claimed in claim 3, wherein the first marker identifies the current debug configuration, and the second marker identifies the new debug configuration.

6. A method as claimed in claim 3, wherein the debug unit embeds the first and second markers into the debug data prior to buffering the debug data.

7. A method as claimed in claim 1, wherein the indication of the current debug configuration and the indication of the new debug configuration are control messages transmitted adjacent to the debug data messages in the message stream.

8. A method as claimed in claim 1, wherein the indication of the current debug configuration comprises the current debug configuration, and the indication of the new debug configuration comprises the new debug configuration.

9. A method as claimed in claim 1, wherein in response to receiving only the single debug reconfiguration command, the debug unit transmits an indication of the current debug configuration, then reconfigures the current debug configuration to a new debug configuration in accordance with the debug reconfiguration command, then transmits an indication of the new debug configuration.

10. A method as claimed in claim 1, further comprising, at the debug unit:
receiving a retrieve debug configuration command, and in response transmitting the indication of the current debug configuration;
after receiving the retrieve debug configuration command, receiving the debug reconfiguration command, and in response reconfiguring the current debug configuration to the new debug configuration; and
after receiving the debug reconfiguration command, receiving a further retrieve debug configuration command, and in response transmitting the indication of the new debug configuration.

11. A method as claimed in claim 1, wherein the debug unit continues to collect debug data and output the debug data in the message stream throughout the reconfiguration method.

12. A method as claimed in claim 11, wherein the debug unit outputs the debug data, the indication of the current debug configuration, and the indication of the new debug configuration to a debug controller, and wherein the debug controller discards debug data received from the debug unit between receipt of the indication of the current debug configuration and receipt of the indication of the new debug configuration.

13. A method as claimed in claim 1, further comprising, at the debug unit, halting collection of debug data of the peripheral circuit and halting outputting the debug data into the message stream between the times at which the indication of the current debug configuration is transmitted and the indication of the new debug configuration is transmitted.

14. A method as claimed in claim 1, wherein the new debug configuration is a compound debug configuration for configuring a plurality of sub-units of the debug unit.

15. A method as claimed in claim 14, wherein at least some of the sub-units are filters, and the compound debug configuration sets parameters of those filters which determines when debug data of the peripheral circuit is collected.

16. A method as claimed in claim 1, wherein the debug unit:
outputs the debug data, the indication of the current debug configuration, and the indication of the new debug configuration to an off-chip debug controller; and
receives the debug reconfiguration command from the off-chip debug controller.

17. A method as claimed in claim 1, wherein the debug unit:
outputs the debug data, the indication of the current debug configuration, and the indication of the new debug configuration to an on-chip debug controller; and
receives the debug reconfiguration command from the on-chip debug controller.

18. An integrated circuit chip comprising:
a debug unit connected to a peripheral circuit, the debug unit having a current debug configuration, and being configured to collect debug data from the peripheral circuit and output that debug data in a message stream;
the debug unit being further configured to:
receive a debug reconfiguration command;
transmit an indication of the current debug configuration, then reconfigure the current debug configuration to a new debug configuration in accordance with the debug reconfiguration command, then transmit an indication of the new debug configuration;
wherein the debug unit is configured to transmit the indication of the current debug configuration and the indication of the new debug configuration adjacent to the debug data in the message stream.

19. An integrated circuit chip as claimed in claim 18, wherein the debug unit comprises a plurality of sub-units, and the new debug configuration is a compound debug configuration, the debug unit being configured to configure the sub-units with the compound debug configuration.

20. An integrated circuit chip as claimed in claim 18, further comprising an on-chip debug controller, wherein the debug unit is configured to:
output the debug data, the indication of the current debug configuration, and the indication of the new debug configuration to the on-chip debug controller; and
receive the debug reconfiguration command from the on-chip debug controller.

* * * * *